United States Patent [19]

Nakamura et al.

[11] Patent Number: 4,655,167
[45] Date of Patent: Apr. 7, 1987

[54] APPARATUS FOR MANUFACTURING OF ABRASION RESISTANT MAGNETIC RECORDING PRODUCT

[75] Inventors: Kyuzo Nakamura; Yoshifumi Ota, both of Yachimata, Japan

[73] Assignee: Nikon Shinku Gijutsu Kabushiki Kaisha, Tokyo, Japan

[21] Appl. No.: 746,169

[22] Filed: Jun. 18, 1985

Related U.S. Application Data

[62] Division of Ser. No. 451,733, Dec. 21, 1982, Pat. No. 4,581,245.

[30] Foreign Application Priority Data

Dec. 24, 1981 [JP] Japan ................................. 56-207996

[51] Int. Cl.⁴ ...................... C23C 14/08; C23C 14/26; C23C 14/30
[52] U.S. Cl. .................................. 118/718; 118/50.1; 118/719; 118/723; 118/730
[58] Field of Search ................ 427/130, 131; 118/719, 118/718, 723, 730, 50.1

[56] References Cited

U.S. PATENT DOCUMENTS 4,015,558  4/1977  Small et al. ...................... 118/719 X
4,220,117  9/1980  Shinohara ........................... 118/718

Primary Examiner—Evan K. Lawrence
Attorney, Agent, or Firm—Armstrong, Nikaido, Marmelstein & Kubovcik

[57] ABSTRACT

A method and apparatus for making an abrasion-resistant magnetic recording product comprising forming a magnetic film on the surface of a substrate in a vacuum container, and thereafter, vapor depositing a lubricant on the surface of the magnetic film in the same vacuum container. If necessary, the surface of the magnetic film can be oxidized in the same vacuum container, prior to vapor depositing the lubricant.

3 Claims, 3 Drawing Figures

APPARATUS FOR MANUFACTURING OF ABRASION RESISTANT MAGNETIC RECORDING PRODUCT

This is a division of application Ser. No. 451,733 filed Dec. 21, 1982, U.S. Pat. No. 4,581,245.

BACKGROUND OF THE INVENTION

This invention relates to an apparatus for manufacturing a ferromagnetic product having improved abrasion resistance.

Recently, magnetic recording products, such as magnetic tape, a magnetic disc or the like have been produced which have an excellent high-density recording property and which are obtained by vapor deposition of a magnetic film of metal or metallic oxide of the surface of a non-magnetic substrate made of synthetic resin or the like. The deposition films include obliquely incident vapor deposited type magnetic film, a Co-Cr vertical deposited type magnetic film, Co-Ni-P plated magnetic film, a -$Fe_2O_3$ sputtered magnetic film, a $BaO-Fe_2O_3$ sputtered magnetic film.

In order to improve an abrasion resisting property of the magnetic film, the inventors of this application have proposed previously a method of manufacturing an improved abrasion resisting magnetic recording product, wherein a vapor deposited coating film of a lubricant of higher fatty acid or metallic salt thereof is formed thinly and firmly on the magnetic film of the magnetic recording product by a vacuum vapor deposition step. (Japanese Patent Application No. 19615/Showa 53 (1978) and Japanese Patent Application No. 62279/Showa 53 (1978)). The inventors, however, have found that there is a relationship between the condition of the surface of the magnetic film and the adhesion strength of the vapor deposition film of the higher fatty acid or metallic salt thereof to the magnetic film. This relationship is especially important when the magnetic film has been exposed to atmospheric air, which results in moisture, $N_2$, dusts or any other contaminating substance in the air being adhered to the surface of the magnetic film. If the magnetic film surface with such contaminants thereon is coated by the vacuum vapor depositing the lubricant, the abrasion resistance of magnetic recording product with the deposited coating film of the lubricant thereon is lowered, because the adherence strength of the deposited coating film of the lubricant at the contaminated surface portions of the surface of the magnetic film, as well as the whole surface of the magnetic film, is lowered and the deposited coating film of the lubricant peels off easily.

SUMMARY OF THE INVENTION

An object of the present invention is to provide an apparatus for manufacturing a magnetic recording product which is free from the above-described defects and has an improved abrasion resisting property, in that a lubricant vapor deposition film is strongly adhered to the surface of a magnetic recording film. The present invention is characterized in that it permits the step of forming a magnetic film on the surface of a substrate in a vacuum container to be followed by the vapor deposition of a lubricant on the surface of the magnetic film in the same vacuum container.

In one embodiment, the apparatus of the present invention comprises a vacuum chamber divided by partitions into zones having means for evaporating a magnetic substance on a substrate in the chamber, means for oxidizing the magnetic substance, and means for evaporating a lubricant on the oxidized substance.

Namely, according to the method practiced by the apparatus of the invention, the magnetic film, which has just been formed by vacuum vapor deposition, is not removed from the container or apparatus for forming the magnetic film, prior to deposition of a lubricant on the surface of the magnetic film. Not removing the magnetic film from the container after it is formed, has the advantages that its surface is still very active and has not been contaminated with any contaminant. Accordingly, instead of being taken outside the container as a product as in the conventional method, the magnetic recording product with the newly formed magnetic film of the present invention is kept in the vacuum container; and then the vacuum vapor deposition of the lubricant is carried out, resulting in the deposition of the lubricant being adhered to the magnetic film by a very strong chemical adsorption force.

DETAILED DESCRIPTION OF THE INVENTION

The following examples of the present invention will be explained with reference to the accompanying drawings. The following is illustrative of the present invention without being limited in any respect.

Figure 1:
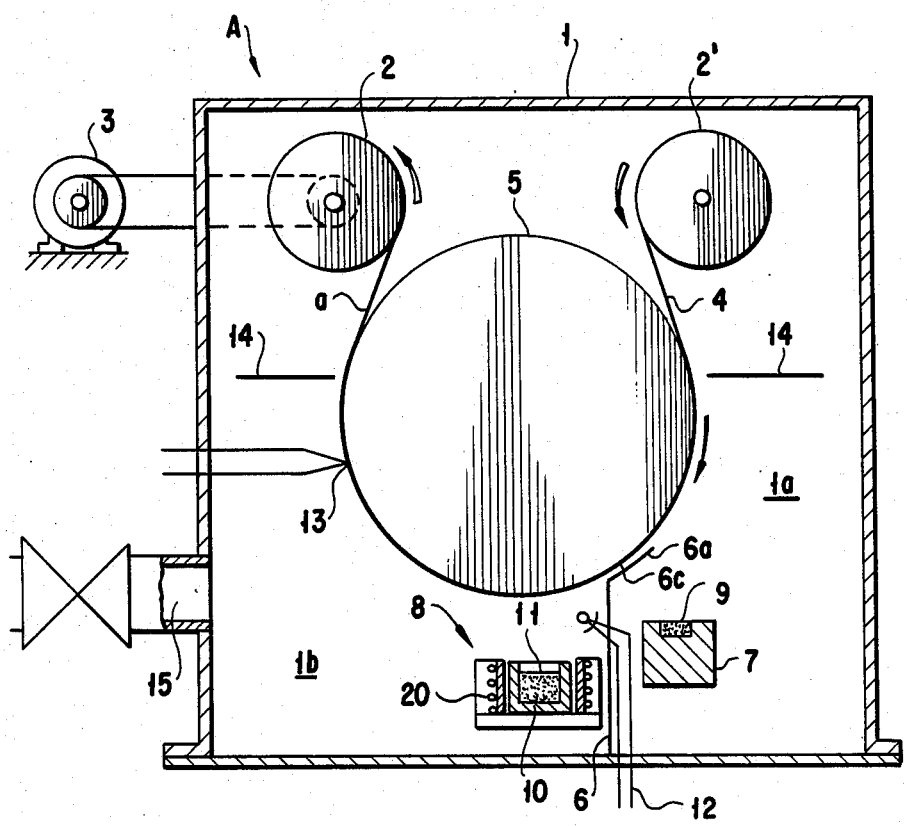
FIG. 1 is a sectional side view of one example of an apparatus of the present invention.

FIG. 1 denotes one example of an apparatus of the present invention. A vacuum vapor deposition treating apparatus is generally designated as A; which includes a vacuum container 1; rollers 2,2' disposed right and left at an upper portion of the interior of the container 1; a driving motor 3 connected through a belt to one of the rollers 2, 2'; and a substrate 4 in a tape form applied in a stretched condition between the rollers 2, 2', which can travel at a predetermined speed. The substrate 4 may be a polyester film of 25 $\mu$m in thickness, which, for example, is mounted, in a rolled form, on the roller 2' serving as a feed roller on the right side of the container 1 and is arranged to be taken up by the roller 2 serving as a take-up roller on the left side of container 1. Between the rollers 2,2', the substrate 4 travels in an arc by being supported by the circumferential surface of a rotary type circular drum 5 of a large diameter disposed below the middle portion of the two rollers 2, 2'. Below the circular drum 5, there is provided a partition plate 6 forming right and left spaces 1a, 1b, respectively. Plate 6 provides a narrow passage 6c between the drum 5 and the forward wall 6a of the plate 6. The right side space 1a is constructed so as to be a magnetic substrate vaporizing space and is provided at its lower portion with an electron beam type heating source 7 for vaporizing a magnetic substance. The left side space 1b is constructed so as to be a lubricant vaporizing space 1b and is provided at its lower portion with a heating apparatus 8 for vaporizing the lubricant, such as any kind of higher fatty acids, metallic salt thereof, amides thereof, or esters thereof. The electron beam type heating source 7 has magnetic substance 9, such as Co-3% Ni, or other ferromagnetic substances contained in a cavity portion thereof so that the substance 9 may be heated and vaporized by the electron beam and so that an oblique incident vapor deposited magnetic film may be formed on the descending tape substrate 4 from the roller 2'. The heating means 8 is provided with a coiled heating wire 20 on the inner circumferential surface of a hollow circular wall thereof so that the foregoing lubricant 11 contained in a crucible 10 put in the center of a top open hollow space of the circular wall may be heated and evaporated, thereby, vapor depositing the lubricant on the surface of the magnetic film, previously formed, as it reaches the lowest region of the arc surface of the drum 5.

Also, in FIG. 1, the container 1 includes an infrared ray type heater 12, by which a resultant magnetic tape a may be heated properly so as to prevent the lubricant from excessively depositing thereon; a pair of thermostats 13 for measuring a temperature of a surface of the tape substrate material; a shield plate 14 horizontally disposed below the respective rollers 2, 2' so that vaporized substances will not adhere to the rollers 2, 2', and an evacuating exhaust opening 15 connected to an evacuating apparatus such as a vacuum pump (not shown).

One example of the method carried out using the apparatus shown in FIG. 1 will now be explained as follows:

While keeping the vaccum container 1 at a pressure of $1 \times 10^{-5}$ Torr or less, the substrate material 4 is unrolled from the side roller 2' at a speed of 20 cm/min. As an oblique surface of the tape substrate 4 descends along the arc of the drum surface 5, vapors of metallic magnetic substance, such as a Co-30% Ni or the like, are coated on substrate 4 at a predetermined incident angle. The vapors for this coating are generated by heating source 7 disposed below the oblique surface of the substrate 4 so that the resultant deposited film thereof may be obtained at a rate of 2000 Å/min in thickness, thereby producing magnetic tape a having an incident vapor deposition type magnetic film on the substrate material 4. This magnetic film may be, for example, 2500 Å in thickness, 10,400 G in saturation magnetization and 900 Oe in coercive force. Thereafter, the magnetic tape a passes through the narrow passage 6c between the forward shield wall 6a of the partition wall 6 and the drum 5, and enters the lubricant vaporizing space 1b. While the magnetic tape a travels along the lower surface of the drum 5, vapors of the rising lubricant, generated by heating the lubricant with the heating apparatus 8 disposed just below the drum 5, are deposited on a surface of the previously formed magnetic film at a rate of 100 Å/min in thickness. Accordingly, the surface of the magnetic tape a is provided with a vapor deposition film of lubricant which may be as thin as the range of about several Å-several hundreds Å, so that an abrasion resisting magnetic recording tape is produced and is taken up by the roller 2 on the other side.

In the course of the above manufacturing process, if the magnetic film of the magnetic tape a is coated by vapor deposition of the lubricant, while magnetic tape a is heated to above about 60° C. by the infrared ray type heater 12; a very thin vapor deposition of the lubricant can be strongly adhered to the magnetic film.

When the surface of the magnetic film is an oxidized film, the vapor deposition of the lubricant by the above method can be adhered more firmly thereto, providing a magnetic recording product which is further improved in abrasion resistance. This has been found by a comparison test.

To further improve the abrasion resistance for the magnetic films formed by evaporation deposition of magnetic metals, it has been found extremely beneficial to oxidize a surface of the metal films before forming the evaporation deposition film of the lubricant thereon. Accordingly, an oxidizing treatment step can be interposed between the two successive treatment steps of the above example. An apparatus for carrying out a preferred example thereof is shown in FIG. 2.

Figure 2:
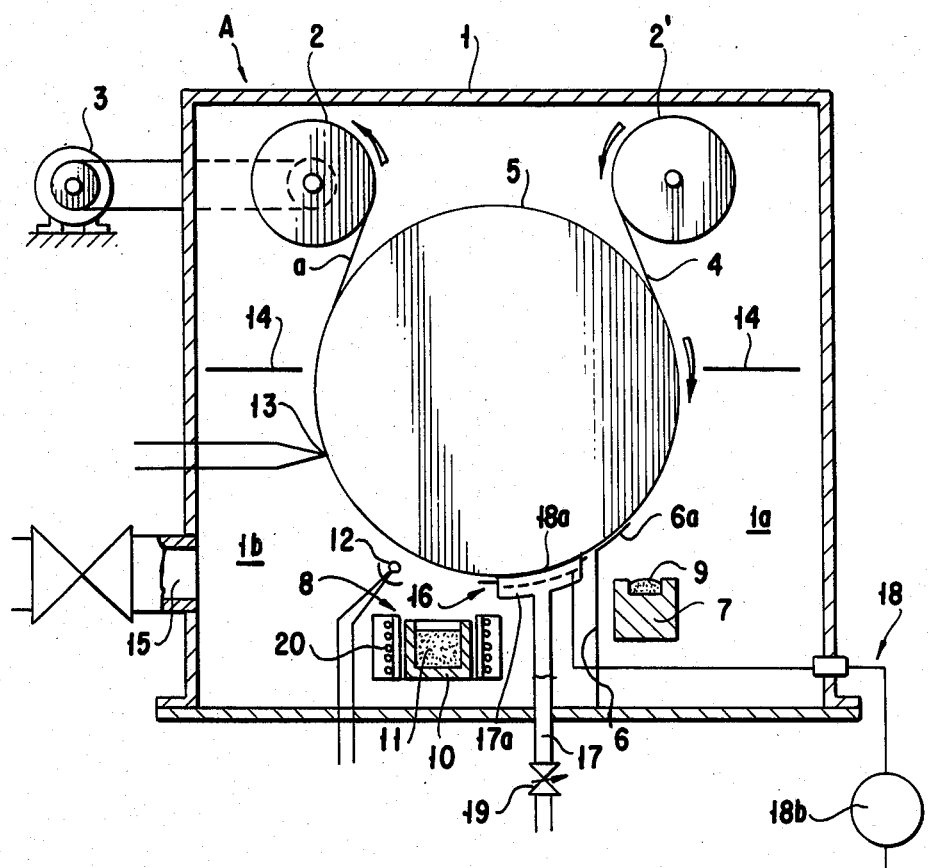
FIG. 2 is a sectional side view of another apparatus of the present invention.

Referring to FIG. 2, in addition to the entire construction of the apparatus for carrying out the example shown in FIG. 1, an oxidizing treatment apparatus is provided therein, as follows:

Namely, an oxidizing apparatus 16 is interposed between the electron beam type heating source 7 and the lubricant evaporating heating apparatus 8. The oxidizing apparatus is composed of a supply pipe 17 for an oxidizing gas such as oxygen or the like and an electrode means 18 for ion-bombardment. A forward end of the supply pipe 17 is formed into a discharge member 17a having a wide opening which faces and is along the lower surface of the drum 5. Electrode 18a of a stainless made mesh-form is contained in the discharge chamber 17a. Electrode 18a faces the lower surface of the drum 5 there-along and is connected to a DC voltage of $-500$ V, for example, by a DC electric source 18b located outside the container 1. By this arrangement, oxygen gas of $2 \times 10^{-2}$ Torr, for example, can be discharged into the discharge chamber from the supply pipe 17, thereby providing ion-bombardment of the magnetic film to oxidize the surface of the metallic magnetic film surface of the magnetic tape a to form an oxidized layer. Thus, during the advance of the tape a from roll 2' to roll 2, the surface of the magnetic film is oxidized prior to the vacuum evaporation deposition of the lubricant rising from the lubricant evaporating heating source 8. Also, in the FIG. 2, a valve 19 is interposed in the gas supply pipe 17, by which the amount of the gas flowing into discharge chamber 17a may be adjusted.

Thus, in the vacuum container, the magnetic film forming step, the step of oxidizing the surface of the magnetic film and the step of evaporation deposition of the lubricant on the oxidized surface of the magnetic film are carried out in succession, so that a magnetic recording product can be simply and efficiently produced, which has a very excellent abrasion resistance property.

Next, the advantages of the above-described aspects of the present invention wil be illustrated by the results of comparison tests as shown in the following table:

| Sample | Method of magnetic tape | Kind of lubricant | Still reproducing life (min.) |
|---|---|---|---|
| No. 1 | Only magnetic film formation | — | 1 |
| No. 2 | After the magnetic film formation, the same is removed from the apparatus for forming the magnetic film, and then the lubricant is deposited thereon in vacuum | Stearic acid<br>Lithium stearate | 18<br>85 |
| No. 3 | The present invention method using the apparatus in FIG. 1. | Stearic acid<br>Lithium stearate | 65<br>130 |
| No. 4 | The present invention method using the appa- | Stearic acid<br>Lithium stearate | above 180<br>above 180 |

| Sample | Method of magnetic tape | Kind of lubricant | Still reproducing life (min.) |
|---|---|---|---|
| | ratus in FIG. 2 | | |

As is clear from the above table, the products, according to the present invention, have an extremely improved abrasion resistance. This is especially true for the products obtained by the vapor deposition of the lubricant after formation of the oxidized layer on the surface of the magnetic metallic film.

Figure 3:
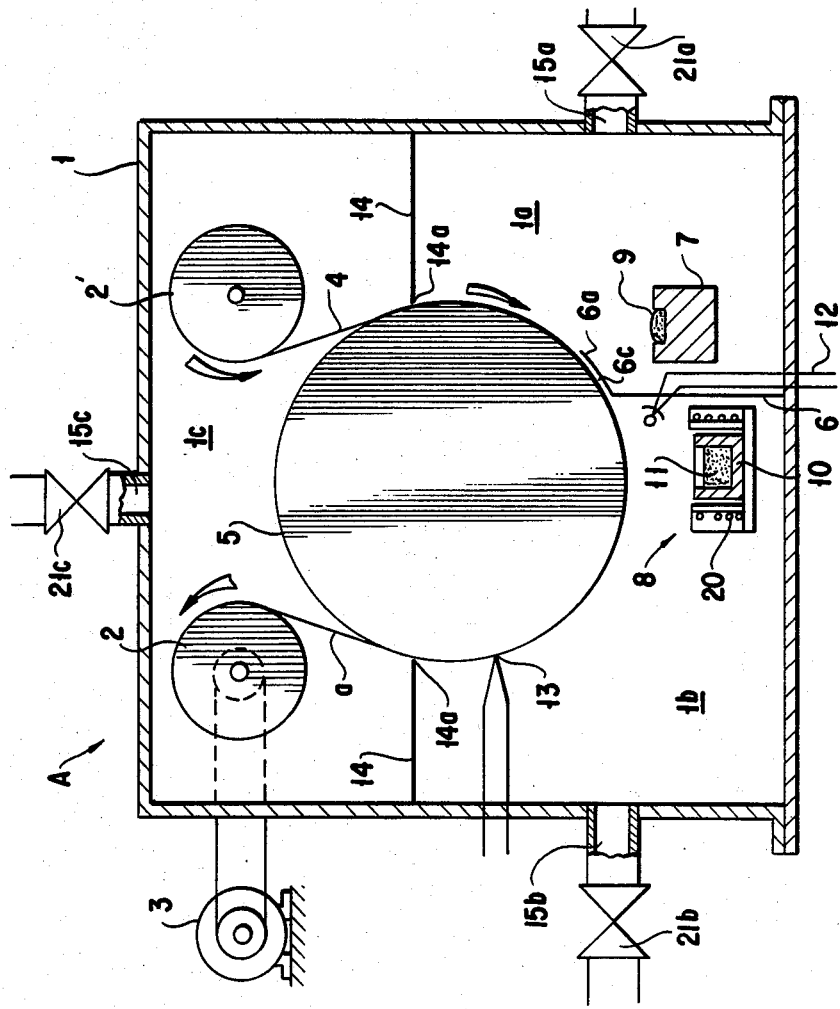
FIG. 3 is a sectional side view of still another apparatus of the present invention.

FIG. 3 shows a modified example of the present invention by using a further apparatus which is substantially the same in construction as that shown in FIG. 1, with the additional features described as follows: Namely, the vacuum container 1 is divided by the vertical partition plate 6c and the horizontal shield plate 14 into individual three spaces 1a, 1b and 1c, while leaving a small passage 14a between the plate 14 and the drum 5. Space 1c contains the rollers 2, 2'. The three spaces 1a, 1b and 1c are provided with individual evacuating exhaust openings 15a, 15b and 15c connecting through respective control valves 21a, 21b and 21c to respective evacuating apparatus, such as vacuum pumps (not shown), so that the respective spaces 1a, 1b, 1c may be provided with individual vacuum conditions.

The space 1c for containing the rollers 2, 2' can be evacuated so as to be maintained at a vacuum degree of $1 \times 10^{-3}$ Torr and the spaces 1a and 1b can be evacuated so as to be maintained at a vacuum degree of $1 \times 10^{-5}$ Torr. Accordingly, it can be assured that the magnetic recording product taken up by the roller 2 in the space 1c is obtained in good condition free from any foreign objects or contaminants. Of course, the vacuum condition of the spaces 1a and 1b may be different from each other.

The present invention has been explained above in detail with respect to the slant incident vapor deposition type magnetic film, but the present invention is also applicable to the vertical deposition type magnetic film or any other magnetic film formed by any process of any kind of magnetic metals and magnetic metallic oxides. Also, the substrate material in the present invention is not limited to the tape, but a disc or other shape or various kinds of materials may be used.

As far as the lubricant is concerned, higher fatty acids, metallic salts thereof, amides thereof and esters thereof which have melting points of above a room temperature, that is, above 30° C., preferably above about 50° C. can be used. For example, there can be used saturated higher fatty acids having more than ten carbon atoms, such as capric acid, lauric acid, myristic acid, palmitic acid, stearic acid, oleic acid, arachidic acid, behenic acid, lignoceric acid, cerotic acid, montanic acid, and so on; metallic salts of unsaturated higher fatty acids and unsaturated higher fatty acids, such as lithium oleinate, sodium potassium barium or aluminum stearates, aluminium laurate; amides thereof, such as stearinamide, palmitinamide, behenamide; and esters, such as heracosyl behenate ester, etc.

Thus, according to the method carried out by the apparatus of the present invention, when making a magnetic recording product in a vacuum container or apparatus, after a magnetic film is formed on a surface of a substrate material, the magnetic recording product is not removed from the container for forming the product; but, instead, is retained in the vacuum container and, after the steps of forming the product, a step of vacuum evaporation deposition of a lubricant thereof is performed on the surface of the magnetic film of the magnetic recording product, so that the chemical adsorption and adherence of the deposited film of the lubricant to the magnetic film is very strong, and a magnetic recording product which has improved abrasion resistance is obtained.

Accordingly, when the magnetic film is made of any magnetic metallic oxide, the chemical adsorption of the lubricant through the oxidation layer to the same is stronger.

When the magnetic film is made of a magnetic metal, after the step of forming the magnetic film on the substrate material surface, the surface of the magnetic film is treated by ion-bombardment with an oxidizing gas so that an oxidized layer may be formed thereon, and thereafter, the vacuum evaporation deposition of the lubricant is performed on the oxidized surface of the magnetic film, which results in a stronger chemical adsorption adhesion thereof to the magnetic film.

What we claim is:

1. An apparatus for manufacturing an abrasion resistant magnetic recording product comprising a single vacuum container having a partition means for dividing the container into a first vaporizing zone having means for evaporating a magnetic substance, a second vaporizing zone having means for evaporating a lubricant and for providing a narrow passageway for a substrate traveling in the vacuum container between the two zones, wherein an oxidizing means for oxidizing the magnetic substance on the substrate is interposed between the two zones.

2. An apparatus as claimed in claim 1, wherein the oxidizing means includes a supply pipe means for supplying an oxygen-containing gas and an electrode means for providing ion-bombardment.

3. An apparatus for manufacturing an abrasion resistant magnetic recording product comprising a single vacuum container, a rotatable drum, and partition plates, the partition plates extending approximately to the rotatable drum and dividing the container into three zones with narrow passageways therebetween, the three zones being a first zone having means for evaporating a magnetic substance, a second zone having means for evaporating a lubricant and a roller zone comprising a feed roller and a take-up roller, the three zones, rotatable drum and passageways being arranged so that a substrate mounted on the feed roller of the roller zone can travel about the rotatable drum sequentially through the narrow passageways to the first vaporizing zone, the second vaporizing zone and the take-up roller mounted in the roller zone.

* * * * *